(12) United States Patent
Shao et al.

(10) Patent No.: US 7,008,821 B1
(45) Date of Patent: Mar. 7, 2006

(54) METHOD OF FORMING A WAFER BACKSIDE INTERCONNECTING WIRE

(75) Inventors: Shih-Feng Shao, Taipei Hsien (TW); Chen-Hsiung Yang, Taipei Hsien (TW); Hsin-Ya Peng, Taipei Hsien (TW)

(73) Assignee: Touch Micro-System Technology Inc., Taoyuan (TW)

( * ) Notice: Subject to any disclaimer, the term of this patent is extended or adjusted under 35 U.S.C. 154(b) by 0 days.

(21) Appl. No.: 10/904,621

(22) Filed: Nov. 19, 2004

(30) Foreign Application Priority Data

Sep. 10, 2004 (TW) .............................. 93127599 A

(51) Int. Cl.
*H01L 21/48* (2006.01)

(52) U.S. Cl. ...................................... 438/108; 438/110

(58) Field of Classification Search ............... 438/6–9,
438/25, 27, 30, 75, 107, 110, 149, 151, 157,
438/258, 309, 342, 411, 108, 112–114, 118–119,
438/127–129, 455, 458–460, 597–599, 912–614,
438/616–618, 637, 640, 671, 700–701, 710,
438/626–628, 666, 667, 689, 692, 694, 706,
438/712, 57, 64–65, 67–69, 73, 98, 106,
438/713, 717, 719, 736–737, 739, 745–746,
438/753, 902, 928, 942; 438/944–945
See application file for complete search history.

(56) References Cited

U.S. PATENT DOCUMENTS

| 4,381,341 | A  | * | 4/1983 | Przybysz et al. | ........... 430/312 |
| 2003/0160293 | A1 | * | 8/2003 | Iadanza | ...................... 257/459 |
| 2004/0121563 | A1 | * | 6/2004 | Farnworth et al. | .......... 438/465 |
| 2005/0067680 | A1 | * | 3/2005 | Boon et al. | .................. 257/678 |

* cited by examiner

*Primary Examiner*—Michael Lebentritt
*Assistant Examiner*—Andre' Stevenson
(74) *Attorney, Agent, or Firm*—Winston Hsu

(57) ABSTRACT

A method of forming a wafer backside interconnecting wire includes forming a mask layer on the back surface, the mask layer including at least an opening corresponding to the bonding pad, performing a first etching process from the back surface to remove the wafer unprotected by the mask layer to form a recess, removing the mask layer, and forming an interconnecting wire on the back surface.

20 Claims, 9 Drawing Sheets

METHOD OF FORMING A WAFER BACKSIDE INTERCONNECTING WIRE

BACKGROUND OF INVENTION

1. Field of the Invention

The present invention relates to a method of forming a wafer backside interconnecting wire, and more particularly, to a method of forming a wafer level chip scale package (WLCSP) using the wafer backside interconnecting wire.

2. Description of the Prior Art

The package technologies of integrated circuits are substantially classified into two types: pin through hole (PTH) and surface mounting technology (SMT). Currently, the ball grid array (BGA) package is the most popular SMT type package. Please refer to FIG. 1, which is a schematic diagram of a BGA package 10. As shown in FIG. 1, the BGA package 10 includes a substrate 12, a die 14 bonded to the surface of the substrate 12 with silver glue 16, and a cap layer 18 which covers the die 14 and the surface of the substrate 12. The die 14 includes a circuit layout (not shown) and a plurality of metal bonding pads 20 electrically connected to the circuit layout (not shown). The BGA package 10 further includes a plurality of solder bumps 22 arranged in arrays on the bottom surface of the substrate 12. Each metal bonding pad 20 of the die 14 is electrically connected to a corresponding solder bump 22 using a conducting wire 24, and therefore the die 14 is connected to a printed circuit board (PCB) via the solder balls 22 for combining with other electronic devices.

As the critical dimension of semiconductor processes diminishes, the integrity of circuit layout improves day by day. Accordingly, the amounts of circuit layout I/O terminals increase as well. Under such a condition, the size of the BGA package 10 inevitably increases for accommodating the numerous metal bonding pads 20. However, this leads to some problems such as the warpage of the substrate 12. Therefore, the concept of chip scale package (CSP) is derived.

A CSP is a package having an area less than 1.5 times the area of a bare die, and the packages formed by various package technologies, e.g. by fine pinch ball grid array (FP BGA) technology or by flip chip (FC) technology, complying with this standard are included.

However, the CSP formed by any of the aforementioned technologies still has some disadvantages or limitations. Regarding the FP BGA technology, although an FP BGA package is consistent with the CSP definition, the FP BGA package suffers from the stress problem between the die and the substrate. In addition, the gap of two adjacent solder balls is limited, and an excessively small gap causes problems while welding the substrate and the PCB. Furthermore, if the die and the substrate are packaged by wire bonding, the area of the package cannot be further reduced. Regarding the FC technology, although the area of an FC package is smaller, the FC technologies cannot be applied to forming some devices, such as optical sensor devices, and print head devices.

In view of the above limitations, the applicant proposes a method of forming a wafer backside interconnecting wire, by which the area of the package is reduced to comply with the wafer level chip scale package (WLCSP) standard (the ratio of the area of package to bare chip is approximately equal to 1). In addition, this method is able to be applied for packaging the devices which require face-up packaging.

SUMMARY OF INVENTION

It is therefore a primary object of the claimed invention to provide a method of forming a wafer backside interconnecting wire to overcome the aforementioned problems.

According to the claimed invention, a method of forming a wafer backside interconnecting wire is provided. The method includes forming a mask layer on the back surface, the mask layer including at least an opening corresponding to the bonding pad, performing a first etching process from the back surface to remove the wafer unprotected by the mask layer to form a recess, removing the mask layer, and forming an interconnecting wire on the back surface.

The method according to the present invention is characterized by forming the interconnecting wires on the backside of the wafer, and thus the area of the package is effectively reduced. In addition, since the wafer is diced subsequent to packaging, the method benefits from mass production, low cost and consistency with standard semiconductor processes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
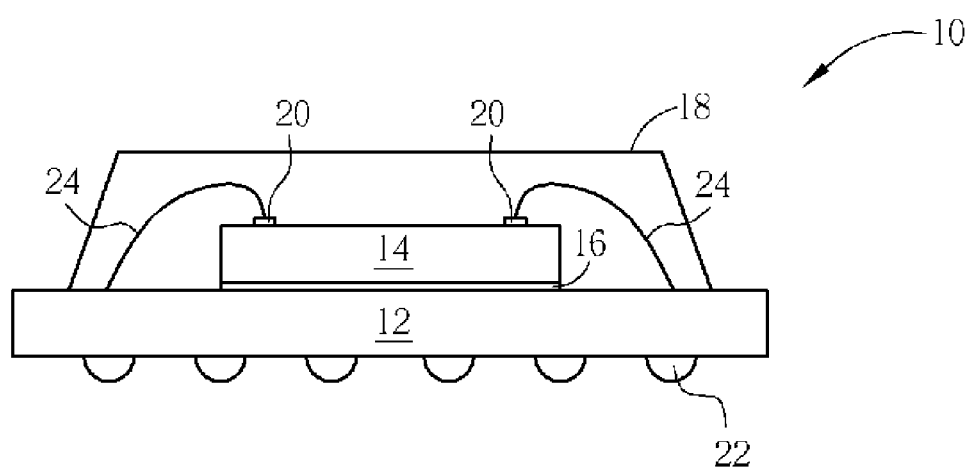
FIG. 1 is a schematic diagram of a BGA package.
Figure 2:
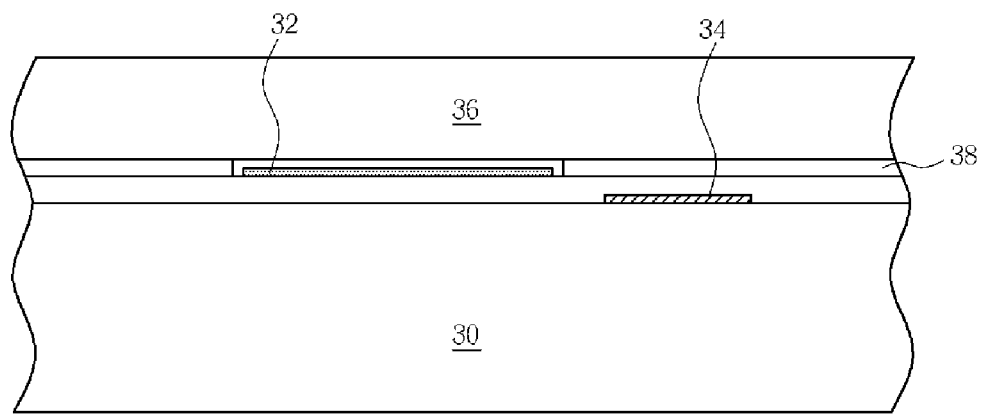
FIG. 2 through FIG. 9 are schematic diagrams illustrating a method of forming a wafer backside interconnecting wire according to a preferred embodiment of the present invention.

Please refer to FIG. 2 through FIG. 9. FIG. 2 through FIG. 9 are schematic diagrams illustrating a method of forming a wafer backside interconnecting wire according to a preferred embodiment of the present invention. As shown in FIG. 2, a wafer 30 is provided. The wafer 30 includes at least a circuit element 32 disposed on the front surface of the wafer 30, and at least a metal bonding pad 34 electrically connected to the circuit element 32 positioned on the front surface of the wafer 30. The front surface of the wafer 30 is bonded to a cap wafer 36 with a bonding layer 38. In this embodiment, the material of the bonding layer 38 is particularly selected from commonly used bonding materials, such as photoresist, epoxy, and UV tape, but is not limited to these materials. The cap wafer 36 and the wafer 30 can also be bonded together in another manners, such as by an anode bonding technique or by a plasma enhanced bonding technique. In addition, if the circuit element 32 is an optical sensor element, such as a CMOS element or a CCD element, the cap wafer 36 has to be transparent.

Figure 3:
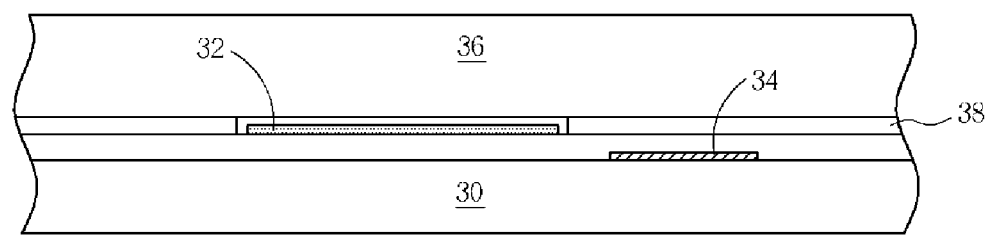

As shown in FIG. 3, a wafer thinning process is performed to reduce the thickness of the wafer 30. In this embodiment, a two-step wafer thinning process including a first wafer thinning process and a second wafer thinning process is selected. The first wafer thinning process is implemented by performing a grinding process and/or a polishing process to preliminarily thin the wafer 30 at a higher rate. The second wafer thinning process is implemented by performing a CMP process, a plasma etching process, a wet etching process, or any combinations of the above processes. The thickness of the wafer 30 is diminished to less than 100 micrometers. It is appreciated that other wafer thinning technologies used on a silicon-on-insulator (SOI) wafer, e.g. smart cut technique, nanocleave technique, or Eltran technique, can also be adopted.

Figure 4:
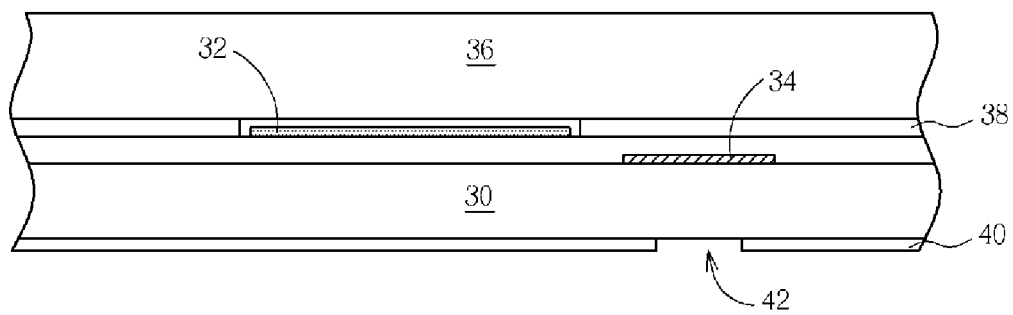
Figure 5:
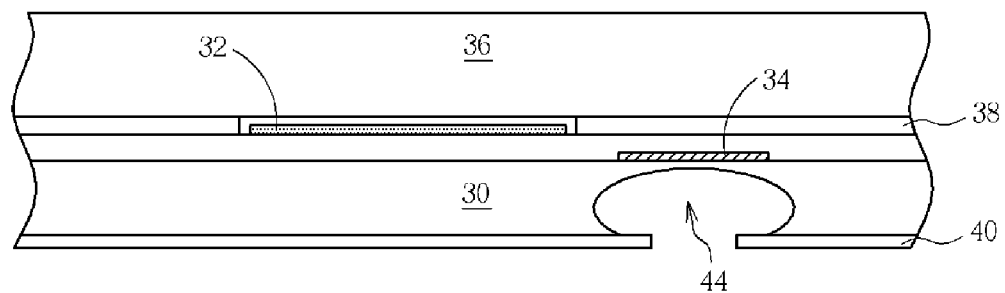

As shown in FIG. 4, a mask layer 40 is then formed on the back surface of the wafer 30, and an opening 42 is defined at a position corresponding to the metal bonding pad 34. In this embodiment, the mask layer 40 is a photoresist layer, and the opening 42 is defined by performing an exposure-and-development process. However, the mask layer 40 can also be a non-photoresist material, such as silicon oxide or silicon nitride, and the opening 42 is accordingly formed by etching. As shown in FIG. 5, an isotropic etching process, e.g. a reactive ion etching (RIE) process or a wet etching process, is performed to remove parts of the wafer 30 inside the opening 42 to form a recess 44 on the back surface of the wafer 30. It is noted that the metal bonding pad 34 here is not exposed.

Figure 6:
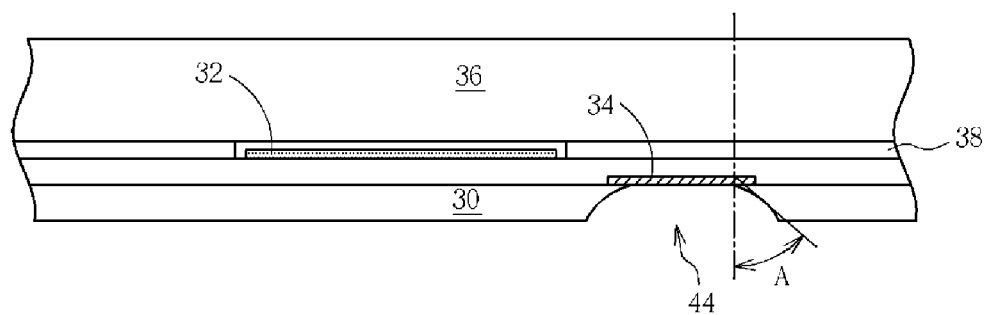

As shown in FIG. 6, the mask layer 40 disposed on the back surface of the wafer 30 is removed, and an etching process is performed from the back surface of the wafer 30 to remove parts of the wafer 30 until exposing the metal bonding pad 34. In addition, the sidewall of the recess 44 is inclined outward as shown. It is appreciated that a two-step etching process is selected in this embodiment. First, an isotropic etching process is carried out to make the recess 44 have a round shape. Subsequently, another etching process is performed to remove the wafer 30 from the back surface so that the sidewall of the recess 44 is inclined outward. After the two-step etching process, the metal bonding pad 34 is exposed, and the outward shape of the recess 40 sidewall ensures the deposition effect of the interconnecting wire which will be formed later. In addition, if the mask layer 40 is a non-photoresist material, an in-situ etching process using different reactants and parameters can be performed to remove the mask layer 40 and a portion of the wafer 30 until exposing the metal bonding pad 34.

It is also appreciated that except for the aforementioned two-step etching process, other etching processes can also be adopted to achieve the same goal. For example, an anisotropic etching process, such as a plasma etching process, can be carried out to remove the wafer 30 inside the recess 44 so that the sidewall of the recess 44 and the normal line of the wafer 30 have an included angle A of between 0 and 90 degrees, preferably between 45 and 90 degrees. In addition, a wet etching process using potassium hydroxide as an etching solution can be performed to etch the wafer 30 in the direction of the wafer 30 lattice. Accordingly, the sidewall of the recess 44 is approximately 54.7 degrees.

Figure 7:
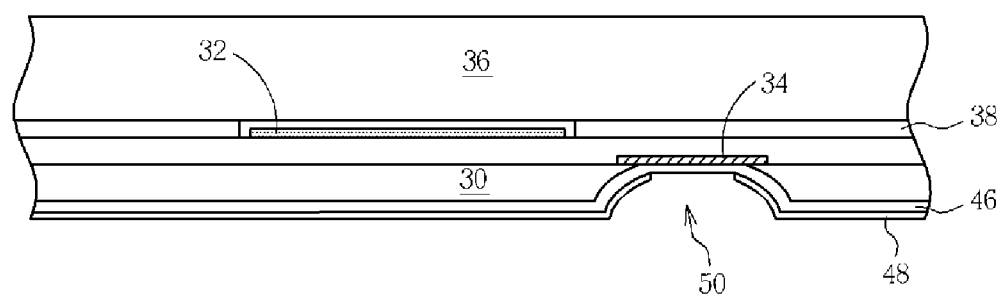
Figure 8:
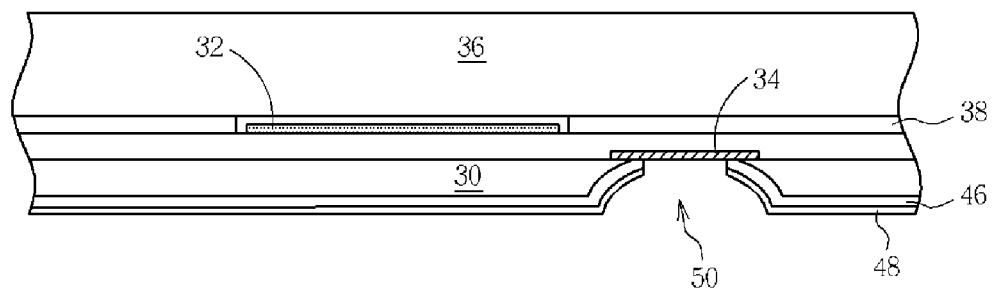

As shown in FIG. 7, a deposition process, e.g. a PECVD process, is performed to deposit an insulating layer 46 on the back surface of the wafer 30. Subsequently, a photoresist layer 48 is coated on the insulating layer 46, and an exposure-and-development process is performed to form an opening 50 in the photoresist layer 48 corresponding to the metal bonding pad 34. As shown in FIG. 8, an etching process, such as an RIE process, is then carried out to remove the insulating layer 46 inside the opening 50 to expose the metal bonding pad 34.

Figure 9:
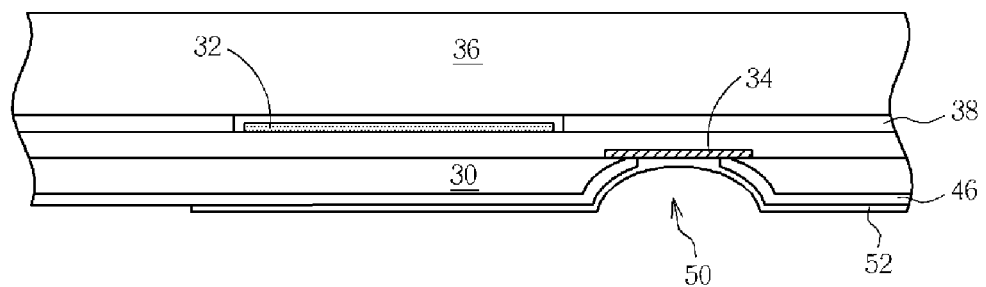

As shown in FIG. 9, the photoresist layer 48 is removed, and an interconnecting wire 52 is formed on the back surface of the wafer 30. In this embodiment, a deposition process is performed to form a conducting layer, such as a metal layer. Then, a photoresist pattern (not shown) is utilized to perform an etching process to define the pattern of the interconnecting wire 52. Finally, the photoresist pattern (not shown) is removed. The fabrication of the interconnecting wire 52 can also be implemented by other techniques, such as by performing a PVD process with a shadow mask to directly form the pattern of the interconnecting wire 52 on the back surface of the wafer 30.

According to the method of the present invention, at least an etching process is performed upon the back surface of the wafer 30 so as to form the recess 44 having a flatter and outward inclined sidewall. Consequently, the interconnecting wire 52 formed later can be well controlled. Once the interconnecting wire 52 is formed, the wafer 30 can be packaged on a package substrate with solder bumps or by other package techniques, such as an FC technique. Following that, the wafer 30 is diced. Therefore, the method benefits from mass production, low cost and consistency with standard semiconductor processes.

In comparison with the prior art, the method of the present invention directly forms the interconnecting wire on the back surface of the wafer, thereby effectively reducing the area of the package for complying with the CSP standard or even the WLCSP standard. In addition, the present invention is beneficial in packaging the optical sensor device or the print head device which require face-up packaging.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a wafer backside interconnecting wire, the wafer comprising a front surface, a back surface, at least a circuit element positioned on the front surface, and at least a bonding pad positioned on the front surface and electrically connected to the circuit element, the method comprising:

forming a mask layer on the back surface, the mask layer comprising at least an opening corresponding to the bonding pad;

performing a first etching process from the back surface to remove the wafer unprotected by the mask layer to form a recess, the first etching process being isotropic, wherein after the first etching process is performed, the recess has a round shape and the bonding pad is kept unexposed;

removing the mask layer;

performing a second etching process from the back surface to etch the wafer until exposing the bonding pad after removing the mask layer; and forming an interconnecting wire on the back surface.

2. The method of claim 1, wherein the wafer further comprises a cap wafer bonded to the front surface of the wafer.

3. The method of claim 2, wherein the cap wafer is bonded to the front surface with a bonding layer.

4. The method of claim 2, wherein the cap wafer is bonded to the front surface by an anodic bonding technique.

5. The method of claim 2, wherein the cap wafer is bonded to the front surface by a plasma enhanced bonding technique.

6. The method of claim 1, further comprising performing a wafer thinning process from the back surface prior to forming the mask layer on the back surface.

7. The method of claim 6, wherein the wafer thinning process is implemented by selectively performing one or any combinations of the processes selected from the group consisting of a grinding process, a polishing process, a chemical mechanical polishing process, a wet etching process, and a plasma etching process.

8. The method of claim 6, wherein the wafer thinning process is a silicon-on-insulator (SOI) wafer thinning process.

9. The method of claim 6, wherein the thickness of the wafer is less than 100 micrometers subsequent to the wafer thinning process.

10. The method of claim 1, wherein forming the interconnecting wire comprises the steps of:
   forming an insulating layer on the back surface, the insulating layer covering the back surface, the wafer inside the recess, and the bonding layer;
   forming a photoresist layer, the photoresist layer having an opening corresponding to the bonding pad;
   removing the insulating layer uncovered by the photoresist layer to expose the bonding pad;
   removing the photoresist layer; and
   forming the interconnecting wire on the back surface.

11. The method of claim 10, wherein the interconnecting wire is defined by depositing and etching technologies.

12. The method of claim 10, wherein the interconnecting wire is defined by thin film technologies in combination with a shadow mask.

13. The method of claim 1, wherein the bonding pad is a metal bonding pad.

14. A method of forming a wafer backside interconnecting wire, the wafer comprising a front surface, a back surface, at least a circuit element positioned on the front surface, and at least a bonding pad positioned on the front surface and electrically connected to the circuit element, the method comprising:
   forming a mask layer on the back surface, the mask layer comprising at least an opening corresponding to the bonding pad;
   performing a first etching process from the back surface to remove the wafer unprotected by the mask layer to form a recess, the first etching process being anisotropic, wherein subsequent to performing the first etching process, the sidewall of the recess is inclined outward, and the bonding pad is exposed;
   removing the mask layer; and
   forming an interconnecting wire on the back surface.

15. The method of claim 14, wherein the wafer further comprises a cap wafer bonded to the front surface of the wafer.

16. The method of claim 15, wherein the cap wafer is bonded to the front surface with a bonding layer.

17. The method of claim 15, wherein the cap wafer is bonded to the front surface by an anodic bonding technique.

18. The method of claim 15, wherein the cap wafer is bonded to the front surface by a plasma enhanced bonding technique.

19. The method of claim 14, further comprising performing a wafer thinning process from the back surface prior to forming the mask layer on the back surface.

20. The method of claim 19, wherein the wafer thinning process is implemented by selectively performing one or any combinations of the processes selected from the group consisting of a grinding process, a polishing process, a chemical mechanical polishing process, a wet etching process, and a plasma etching process.

* * * * *